United States Patent
Bian et al.

(10) Patent No.: US 9,412,404 B2
(45) Date of Patent: Aug. 9, 2016

(54) ONSET LAYER FOR PERPENDICULAR MAGNETIC RECORDING MEDIA

(75) Inventors: Xiaoping Bian, Saratoga, CA (US); Jack Jyh-Kau Chang, Fremont, CA (US); Mark F. Mercado, Morgan Hill, CA (US); Mohammad T. Mirzamaani, San Jose, CA (US); Kai Tang, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 684 days.

(21) Appl. No.: 12/638,894

(22) Filed: Dec. 15, 2009

(65) Prior Publication Data

US 2011/0141609 A1     Jun. 16, 2011

(51) Int. Cl.
| | |
|---|---|
| G11B 5/66 | (2006.01) |
| G11B 5/84 | (2006.01) |
| C23C 14/06 | (2006.01) |
| C23C 14/34 | (2006.01) |
| G11B 5/73 | (2006.01) |
| G11B 5/851 | (2006.01) |

(52) U.S. Cl.
CPC .......... *G11B 5/8404* (2013.01); *C23C 14/0688* (2013.01); *C23C 14/3414* (2013.01); *G11B 5/7325* (2013.01); *G11B 5/851* (2013.01)

(58) Field of Classification Search
None
See application file for complete search history.

(56) References Cited

U.S. PATENT DOCUMENTS

| | | | |
|---|---|---|---|
| 6,146,755 A | 11/2000 | Guha et al. | 428/332 |
| 7,368,185 B2 | 5/2008 | Hirayama et al. | 428/831.2 |
| 7,416,794 B2 | 8/2008 | Maeda et al. | 428/832 |
| 2005/0058855 A1* | 3/2005 | Girt | 428/694 TS |
| 2006/0057431 A1* | 3/2006 | Tamai | G11B 5/65 428/836.2 |
| 2007/0065955 A1 | 3/2007 | Maeda et al. | 438/3 |
| 2007/0148500 A1* | 6/2007 | Maeda | C23C 14/0688 428/832 |
| 2007/0248843 A1* | 10/2007 | Wu et al. | 428/827 |
| 2007/0292721 A1* | 12/2007 | Berger et al. | 428/828.1 |
| 2008/0090002 A1 | 4/2008 | Maeda et al. | 427/131 |
| 2008/0182131 A1 | 7/2008 | Iwasaki | 428/800 |
| 2008/0204933 A1* | 8/2008 | Hailu et al. | 360/135 |
| 2008/0292909 A1* | 11/2008 | Igarashi et al. | 428/846.5 |
| 2009/0116137 A1 | 5/2009 | Takekuma et al. | 360/75 |
| 2010/0129685 A1* | 5/2010 | Gao et al. | 428/827 |
| 2010/0159284 A1* | 6/2010 | Choe et al. | 428/831 |

FOREIGN PATENT DOCUMENTS

| | | |
|---|---|---|
| JP | 2002/334424 | 11/2002 |
| JP | 2004/220737 | 8/2004 |
| JP | 2009/009701 | 1/2009 |
| WO | 2009/028447 | 3/2009 |
| WO | 2009/035411 | 3/2009 |

OTHER PUBLICATIONS

Shintaku, Kazuhiko, "Magnetic Interaction Between Recording Layer and Soft Underlayer in Granular-Type Perpendicular Magnetic Recording Media with Thin Intermediate Layer" IEEE Transactions on Magnetics, vol. 44, No. 11, Nov. 2008.

* cited by examiner

*Primary Examiner* — Holly Rickman
*Assistant Examiner* — Linda Chau
(74) *Attorney, Agent, or Firm* — Zilka-Kotab, PC

(57) ABSTRACT

A magnetic storage medium according to one embodiment includes a substrate; an onset layer formed above the substrate, the onset layer comprising ruthenium and titanium oxide; and a magnetic oxide layer formed directly on the onset layer. A method according to one embodiment includes sputtering using a target of ruthenium and titanium oxide for forming an onset layer above a substrate, the onset layer comprising ruthenium and titanium oxide; and forming a magnetic oxide layer directly on the onset layer. Additional systems and methods are also presented.

3 Claims, 3 Drawing Sheets

ONSET LAYER FOR PERPENDICULAR MAGNETIC RECORDING MEDIA

FIELD OF THE INVENTION

The present invention relates to magnetic media, and more particularly, this invention relates to a magnetic medium having an onset layer.

BACKGROUND OF THE INVENTION

Developments have been made in the area of perpendicular magnetic recording media, with much of them focusing on increasing the recording density of the magnetic recording media by decreasing the bit error rate. A lower bit error rate can be achieved by decreasing the transition noise between adjacent bits, and the transition noise in turn can be decreased by increasing the magnetic decoupling between grains. Grains that are decoupled and magnetically isolated from one another can switch independently and may allow the media to form finer and narrower transitions. Therefore, it would be beneficial to the improvement of perpendicular recording media to magnetically decouple the magnetic grains of the magnetic layer of a magnetic recording medium.

SUMMARY OF THE INVENTION

A magnetic storage medium according to one embodiment includes a substrate; an onset layer formed above the substrate, the onset layer comprising ruthenium and titanium oxide; and a magnetic oxide layer formed directly on the onset layer.

A magnetic storage medium according to another embodiment includes a substrate; an onset layer formed above the substrate, the onset layer comprising ruthenium and titanium oxide, wherein a deposition thickness of the onset layer is between about 2 angstroms and about 8 angstroms, wherein a titanium oxide concentration in the onset layer is between about 4.0 molecular % and about 12 molecular %; and a magnetic oxide layer formed directly on the onset layer, wherein the onset layer is formed directly on a ruthenium underlayer stack having at least one layer of ruthenium formed under a relatively higher pressure and at least one layer of ruthenium formed under a relatively lower pressure.

A method according to one embodiment includes sputtering using a target of ruthenium and titanium oxide for forming an onset layer above a substrate, the onset layer comprising ruthenium and titanium oxide; and forming a magnetic oxide layer directly on the onset layer.

According to another embodiment, a system includes a magnetic storage medium, at least one head for reading from and/or writing to the magnetic medium, a slider for supporting the at least on head, and a control unit coupled to the at least one head for controlling operation of the at least one head. The magnetic storage medium comprises a substrate, an onset layer comprising ruthenium and titanium oxide formed above the substrate, and a magnetic oxide layer formed directly on the onset layer.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a magnetic storage medium comprises a substrate; an onset layer formed above the substrate, the onset layer comprising ruthenium and titanium oxide; and a magnetic oxide layer formed directly on the onset layer.

In another general embodiment, a magnetic storage medium comprises a substrate; an onset layer formed above the substrate, the onset layer comprising ruthenium and titanium oxide, wherein a deposition thickness of the onset layer is between about 2 angstroms and about 8 angstroms, wherein a titanium oxide concentration in the onset layer is between about 4 molecular % and about 12 molecular %; and a magnetic oxide layer formed directly on the onset layer. The onset layer is formed directly on a ruthenium underlayer stack having at least one layer of ruthenium formed under a relatively higher pressure and at least one layer of ruthenium formed under a relatively lower pressure. In a version of this embodiment, the onset layer causes the medium to exhibit an at least 0.2 orders of magnitude lower bit error rate than an otherwise identical magnetic storage medium not having the onset layer.

In another general embodiment, a method comprises sputtering using a target of ruthenium and titanium oxide for forming an onset layer above a substrate, the onset layer comprising ruthenium and titanium oxide; and forming a magnetic oxide layer directly on the onset layer.

In yet another general embodiment, a system includes a magnetic storage medium, at least one head for reading from and/or writing to the magnetic medium, a slider for supporting the at least on head, and a control unit coupled to the at least one head for controlling operation of the at least one head. The magnetic storage medium comprises a substrate, an onset layer comprising ruthenium and titanium oxide formed above the substrate, and a magnetic oxide layer formed directly on the onset layer.

Figure 1:
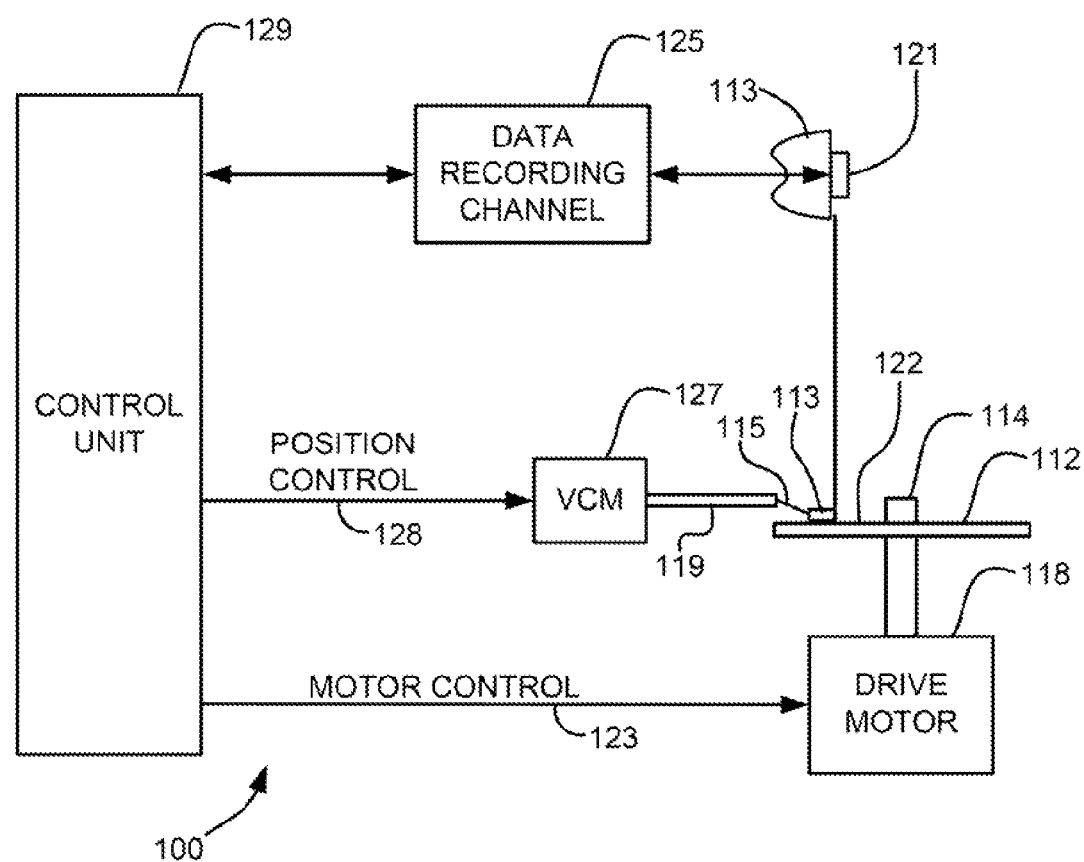
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by control unit 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

It has been surprisingly found that by adding an onset layer above a substrate and below an oxide layer of a magnetic storage medium, such as a magnetic disk, the performance of the magnetic storage medium can be increased.

For magnetic disks, according to some embodiments, decoupling of the initial magnetic layer is useful for reducing the noise of perpendicular media. In order to accomplish this decoupling effect, an onset layer comprised of Ru and $TiO_2$ is introduced underneath the magnetic layer, according to some approaches. The onset layer comprising such materials as described previously has surprisingly been found to enhance grain decoupling of the magnetic layer at the initial growth stage, leading to a decreased media bit error rate and a reduction of magnetic core width. In addition, according to some approaches, by introducing the onset layer underneath the magnetic oxide layer, an increased switching field distribution, SFD, may surprisingly be achieved, indicating more decoupling of the magnetic grains. Recording parametric measurements indicate a 0.2 to 0.4 order improvement in bit error rate (BER) and adaptive format bit error rate (AF_BER), with about 1 nm to about 2 nm narrower magnetic core width (MCW). This result could not have been predicted.

Referring to Table 1 below, it can be seen that magnetic media including an onset layer, according to one embodiment, has better recording characteristics than current film designs with another conventional structure. Moreover, addition of the onset layer produced a negligible change on overwrite (OW).

TABLE 1

Recording Parametric Measurements

| Sample | Description | SFD | BER | AF_BER | MCW | OW |
|---|---|---|---|---|---|---|
| 1 | Current Film Design | 2425 | −5.54 | −5.09 | 80.9 | −38.8 |
| 2 | Design w/Onset Layer | 2550 | −5.75 | −5.55 | 79.3 | −36.9 |

Figure 2:
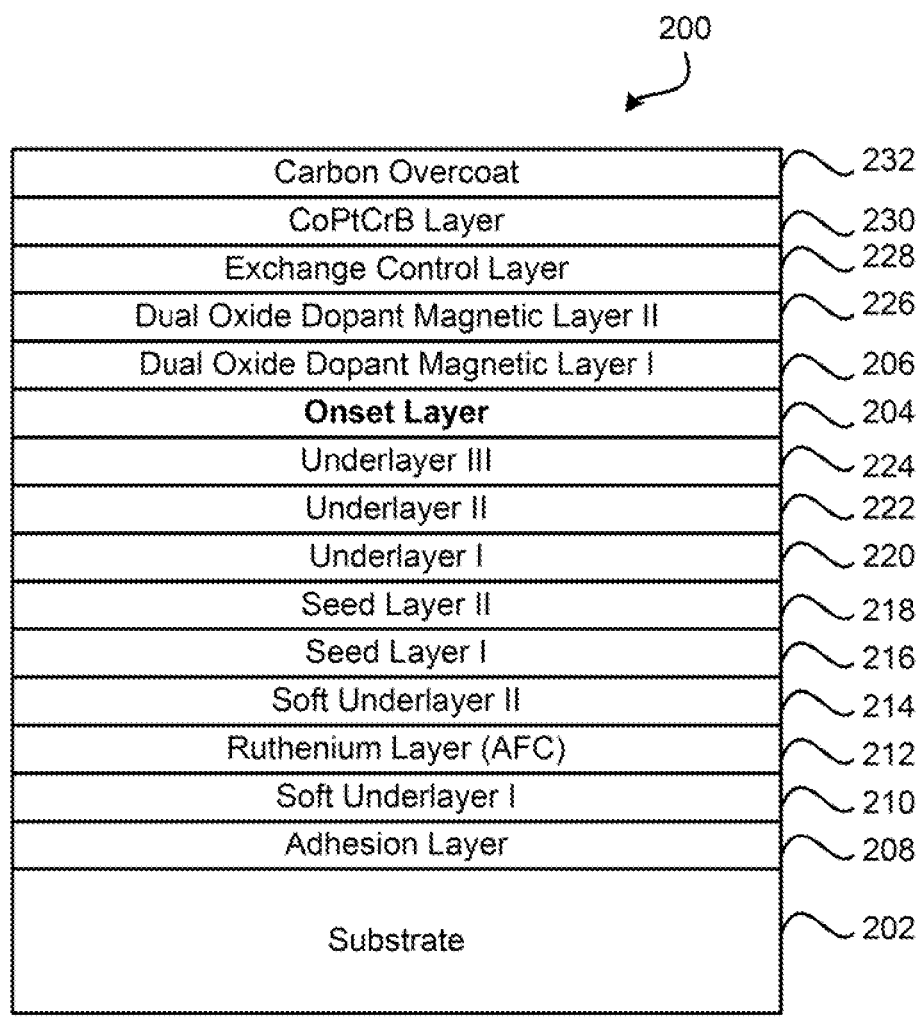
FIG. 2 is a schematic representation of layers of a magnetic storage medium, according to one embodiment.

Now referring to FIG. 2, in one embodiment, a magnetic storage medium 200 (e.g., a magnetic disk in a hard disk drive (HDD), etc.) is described. FIG. 2 is a highly simplified schematic diagram of a cross-sectional view of a magnetic storage medium 200, which extends in either direction horizontally from the view shown. The magnetic storage medium 200 includes a substrate 202, an onset layer 204 comprising ruthenium and titanium oxide formed above the substrate 202, and a magnetic oxide layer 206 formed directly on the onset layer 204. By directly on the onset layer 204, what is meant is that the oxide layer 206 contacts the onset layer 204, and may possibly be formed by oxidizing a portion of the onset layer 204, thereby producing an amount of oxidation on an outside portion of the onset layer 204 during formation. In another approach, the oxide layer 206 may be formed of another, distinct layer from the onset layer 204, but is formed directly on the onset layer 204.

In some embodiments, the oxide layer 206 may be comprised of titanium oxide, $TiO_x$. Moreover, a second oxide layer 226 may be formed above the oxide layer 206. Additional layers may include an exchange control layer 228, a cap layer 230 and an optional overcoat 232 e.g. of carbon.

Each layer shown in FIG. 2 may be formed through sputtering, or any other technique known in the art. Each layer may have a different composition from those described below in one illustrative embodiment. Moreover, layers may be added and/or removed in some embodiments. The substrate 202 may be formed of a glass material, and may have a greater thickness than the other layers formed thereon. The adhesion layer 208 may be comprised of aluminum, titanium, or compositions thereof, etc., and may function to prevent the layers formed above the substrate 202 from "peeling off" during use. The soft underlayers 210, 214 are separated by a ruthenium break layer 212, and may be comprised of cobalt, iron, tantalum, zirconium, or compositions thereof, etc., which provide a high moment. The ruthenium break layer 212 is also referred to as an anti-ferromagnetic coupling layer (AFC). The seed layers 216, 218 may be comprised of any suitable material as would be known in the art, such as nickel, tungsten, chromium, titanium, or combinations thereof, etc. The underlayers 220, 222, 224 may be comprised of any suitable material as would be known in the art, such as ruthenium, and may be formed under different pressures, such as a lower pressure for underlayer 1, 220, and higher pressures for underlayers II, III, 222, 224, respectively.

According to some approaches, a deposition thickness of the onset layer 204 may be between about 2.0 Å and about 20 Å, where "about X angstroms" indicates "X±1.0 Å." In more approaches, a deposition thickness of the onset layer 204 may be between about 5.0 Å and about 8.0 Å.

In more embodiments, a sputter chamber may be used to form at least a portion of the onset layer 204. In the sputter chamber, an oxygen concentration during formation of the onset layer 204 may be between about 0.01 vol % and about 0.50 vol % (volume percentage), where "about X vol %" indicates "X±0.01." In addition, at least some oxygen is present, e.g., there is not 0 vol % oxygen in the sputter chamber during onset layer 204 formation.

According to some more approaches, a titanium oxide concentration in the onset layer 204 may be between about 4.0 molecular % and about 12 molecular %, where "about X molecular %" indicates "X±1.0 molecular %." In more approaches, a titanium concentration in the onset layer 204 may be between about 1.5 atomic % and about 4.0 atomic %.

In more approaches, an oxygen concentration in the onset layer 204 may be between about 3.0 atomic % and about 8.0 atomic %.

According to some embodiments, the onset layer 204 may be formed directly on a ruthenium underlayer stack (e.g., underlayers I, II, III, 220, 222, 224) having at least one layer of ruthenium formed under a relatively higher pressure and at least one layer of ruthenium formed under a relatively lower pressure, the pressures being relative to each other.

In more embodiments, the onset layer 204 may cause the magnetic storage medium 200 to exhibit an at least 0.2 order of magnitude lower bit error rate (BER) than an otherwise identical magnetic storage medium not having the onset layer 204 under identical conditions, e.g., if both the present medium and the comparative medium were written to and read by the same head under identical operating conditions. In further embodiments, the onset layer may cause the magnetic storage medium 200 to exhibit an at least 0.3 order of magnitude lower BER than an otherwise identical magnetic storage medium not having the onset layer.

According to some approaches, the onset layer 204 may cause the medium 200 to exhibit the physical property of having a written magnetic core width that is at least about 1 nm narrower than would be exhibited by an otherwise identical magnetic storage medium not having the onset layer under identical writing conditions, e.g., if written by the same head at the same fly height.

In some approaches, a deposition thickness of the onset layer 204 may be between about 5.0 Å and about 10 Å. In addition, a titanium oxide concentration in the onset layer 204 may be between about 4.0 molecular % and about 12 molecular %, and the onset layer 204 may cause the medium 200 to exhibit an at least 0.2 orders of magnitude lower BER than an otherwise identical magnetic storage medium not having the onset layer.

With continued reference with FIG. 2, in another embodiment, a magnetic storage medium 200 comprises a substrate 202, an onset layer 204 comprising ruthenium and titanium oxide formed above the substrate 202, and a magnetic oxide layer 206 formed directly on the onset layer 204. A deposition thickness of the onset layer 204 is between about 2.0 Å and about 8.0 Å, and a titanium oxide concentration in the onset layer 204 is between about 4 molecular % and about 12 molecular %. Also, the onset layer 204 is formed directly on a ruthenium underlayer stack (e.g., underlayer 1 220, underlayer II 222, underlayer III 224) having at least two layers of ruthenium, one layer of ruthenium formed under a relatively higher pressure and one layer of ruthenium formed under a relatively lower pressure, the pressures being relative to each other. In addition, the onset layer 204 causes the magnetic storage medium 200 to exhibit an at least 0.2 orders of magnitude lower BER than an otherwise identical magnetic storage medium not having the onset layer under identical conditions, e.g., if both the present medium and the comparative medium were written to and read by the same head under identical operating conditions. In some additional approaches, the onset layer 204 may cause the medium 200 to exhibit an at least 0.3 orders of magnitude lower BER than an otherwise identical magnetic storage medium not having the onset layer 204.

According to some approaches, a sputter chamber may be used to form at least a portion of the onset layer 204. In the sputter chamber, an oxygen concentration during formation of the onset layer 204 may be between about 0.01 vol % and about 0.50 vol % (volume percentage), where "about X vol %" indicates "X±0.01." In addition, at least some oxygen is present, e.g., there is not 0 vol % oxygen in the sputter chamber during onset layer 204 formation.

In more approaches, the onset layer 204 may cause the magnetic storage medium 200 to exhibit the physical property of having a written magnetic core width that is at least 1.0 nm narrower than would be exhibited by an otherwise identical magnetic storage medium not having the onset layer under identical writing conditions, e.g., if written by the same head at the same fly height.

Figure 3:
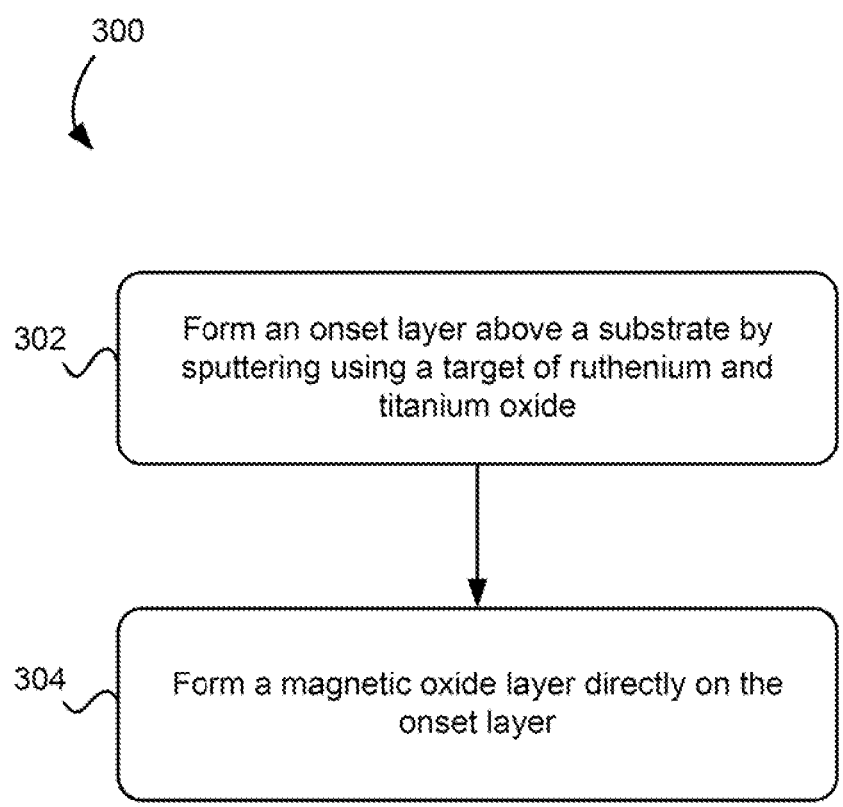
FIG. 3 is a flowchart showing a method according to one embodiment.

Now referring to FIG. 3, a method 300 is described according to one embodiment. The method 300 may be carried out in any desired environment, and may include aspects described in accordance with embodiments depicted in FIGS. 1-2.

In operation 302, an onset layer is formed above a substrate by sputtering using a target of ruthenium and titanium oxide. The onset layer comprises ruthenium and titanium oxide after the sputtering.

In one embodiment, the target may comprise less than about 8 atomic % ruthenium relative to the total atomic percentages of all components.

In some approaches, a sputter chamber may be used to form at least a portion of the onset layer. In the sputter chamber, oxygen and an inert gas are flowed during the sputtering, and a volumetric flow rate of the oxygen is between about 1.0% and about 4.0% of a total volumetric flow rate of the oxygen and the inert gas. For example, in one experiment, the flowrates of oxygen and argon (as the inert gas) were 4.0 sccm and 195 sccm, respectively.

In more approaches, no oxygen may be flowed into the sputter chamber during formation of any other layers of a magnetic storage medium formed by the sputtering.

According to some approaches, a deposition thickness of the onset layer may be between about 5.0 Å and about 10 Å, preferably about 7.0 Å. In addition, "about X atomic %" indicates "X±1.0 atomic %." According to one preferred embodiment, a deposition thickness of the onset layer may be about 7.0 Å.

In some approaches, a titanium oxide concentration in the onset layer may be between about 4.0 molecular % and about 12 molecular %, titanium between about 1.5 atomic % and about 4.0 atomic %, and oxygen between about 3 atomic % and about 8 atomic %, etc.

In operation 304, a magnetic oxide layer is formed directly on the onset layer. By directly on the onset layer, what is meant is that the oxide layer contacts the onset layer, and may possibly be formed by oxidizing a portion of the onset layer, thereby producing an amount of oxidation on an outside portion of the onset layer. In another approach, the oxide layer may be formed of another, distinct layer from the onset layer, but is formed directly above the onset layer.

According to another embodiment, a system includes a magnetic storage medium, at least one head for reading from and/or writing to the magnetic medium, a slider for supporting the at least on head, and a control unit coupled to the at least one head for controlling operation of the at least one head. The magnetic storage medium may include any of the properties and structures as described previously. For example, the magnetic medium may comprise a substrate, an onset layer comprising ruthenium and titanium oxide formed above the substrate, and a magnetic oxide layer formed directly on the onset layer.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic storage medium, comprising:
a substrate;
a first Ru layer formed above the substrate;
a second Ru layer formed directly on the first Ru layer, a physical interface being defined between the first Ru layer and the second Ru layer;
a third Ru layer formed directly on the second Ru layer, a physical interface being defined between the second Ru layer and the third Ru layer, wherein the first, second and third Ru layers each have a same chemical composition consisting of Ru;
an onset layer formed above the substrate, the onset layer consisting of Ru and $TiO_x$, wherein a deposition thickness of the Ru and $TiO_x$ onset layer is in a range from 2 angstroms to 4 angstroms, wherein a Ru concentration in the onset layer is in a range from greater than 0 atomic % to less than 8 atomic %;
a first dual oxide magnetic layer formed directly on the onset layer;
a second dual oxide magnetic layer formed directly on the first dual oxide magnetic layer;
an exchange control layer above the second dual oxide magnetic layer;
a magnetic cap layer above the exchange control layer, wherein the magnetic cap layer consists of CoPtCrB; and
a carbon overcoat layer above the magnetic cap layer.

2. The magnetic storage medium as recited in claim 1, wherein the deposition thickness of the onset layer is 2.0 angstroms.

3. The magnetic storage medium as recited in claim 1, wherein an interface between the onset layer and the first dual oxide magnetic layer includes a region of oxidation.

* * * * *